(12) United States Patent
Saunajoki (10) Patent No.: US 12,351,912 B2
(45) Date of Patent: Jul. 8, 2025

(54) TARGETED TEMPORAL ALD (71) Applicant: MICROSOFT TECHNOLOGY LICENSING, LLC, Redmond, WA (US)

(72) Inventor: Ville Kalevi Saunajoki, Kirkkonummi (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 291 days.

(21) Appl. No.: 17/708,511

(22) Filed: Mar. 30, 2022

(65) Prior Publication Data
US 2023/0313373 A1 Oct. 5, 2023

(51) Int. Cl.
*C23C 16/455* (2006.01)
*C23C 16/44* (2006.01)
*C23C 16/52* (2006.01)

(52) U.S. Cl.
CPC .... *C23C 16/45544* (2013.01); *C23C 16/4412* (2013.01); *C23C 16/45502* (2013.01); *C23C 16/45563* (2013.01); *C23C 16/52* (2013.01)

(58) Field of Classification Search
CPC .............. C23C 16/45576; C23C 16/52; C23C 16/45563; C23C 16/4412; C23C 16/45519; C23C 16/45502; C23C 16/45544
See application file for complete search history.

(56) References Cited

U.S. PATENT DOCUMENTS

| | | |
|---|---|---|
| 2003/0000473 A1 | 1/2003 | Chae et al. |
| 2011/0033638 A1 | 2/2011 | Ponnekanti et al. |
| 2015/0167166 A1 | 6/2015 | Hwang et al. |
| 2017/0167017 A1 | 6/2017 | Lavoie et al. |

OTHER PUBLICATIONS

"International Search Report and Written Opinion Issued in PCT Application No. PCT/US22/054010", Mailed Date: May 8, 2023, 11 Pages.

*Primary Examiner* — Joseph A Miller, Jr.
(74) *Attorney, Agent, or Firm* — Workman Nydegger (57) ABSTRACT

A targeted temporal ALD device includes an ALD head that is configured to perform targeted ALD to discrete targeted areas of products/substrates positioned on the mounting surface(s) of the ALD device. The ALD head includes: (i) an outer housing; (ii) an inner housing positioned within the outer housing; and (ii) a plurality of ports formed into the inner housing and outer housing for connecting at least one precursor gas source and at least one inert gas source to the ALD head. The precursor gases are applied to targeted areas of the products/substrates from an inner chamber in the inner housing, while inert gases are applied to an outer chamber between the inner and outer housings to limit/control application of the precursor gases to a desired target area. Some targeted temporal ALD devices are also configured to position/reposition the ALD head in three orthogonal directions relative to product(s)/mounting surface(s).

18 Claims, 8 Drawing Sheets

FIG. 8

TARGETED TEMPORAL ALD

BACKGROUND

Background and Relevant Art

Atomic layer deposition (ALD) is a proven technique for growing thin films with perfect conformality and uniformity of thickness with atomic granularity. There are two conventional types of ALD processing, namely, temporal ALD and spatial ALD.

Figure 1:
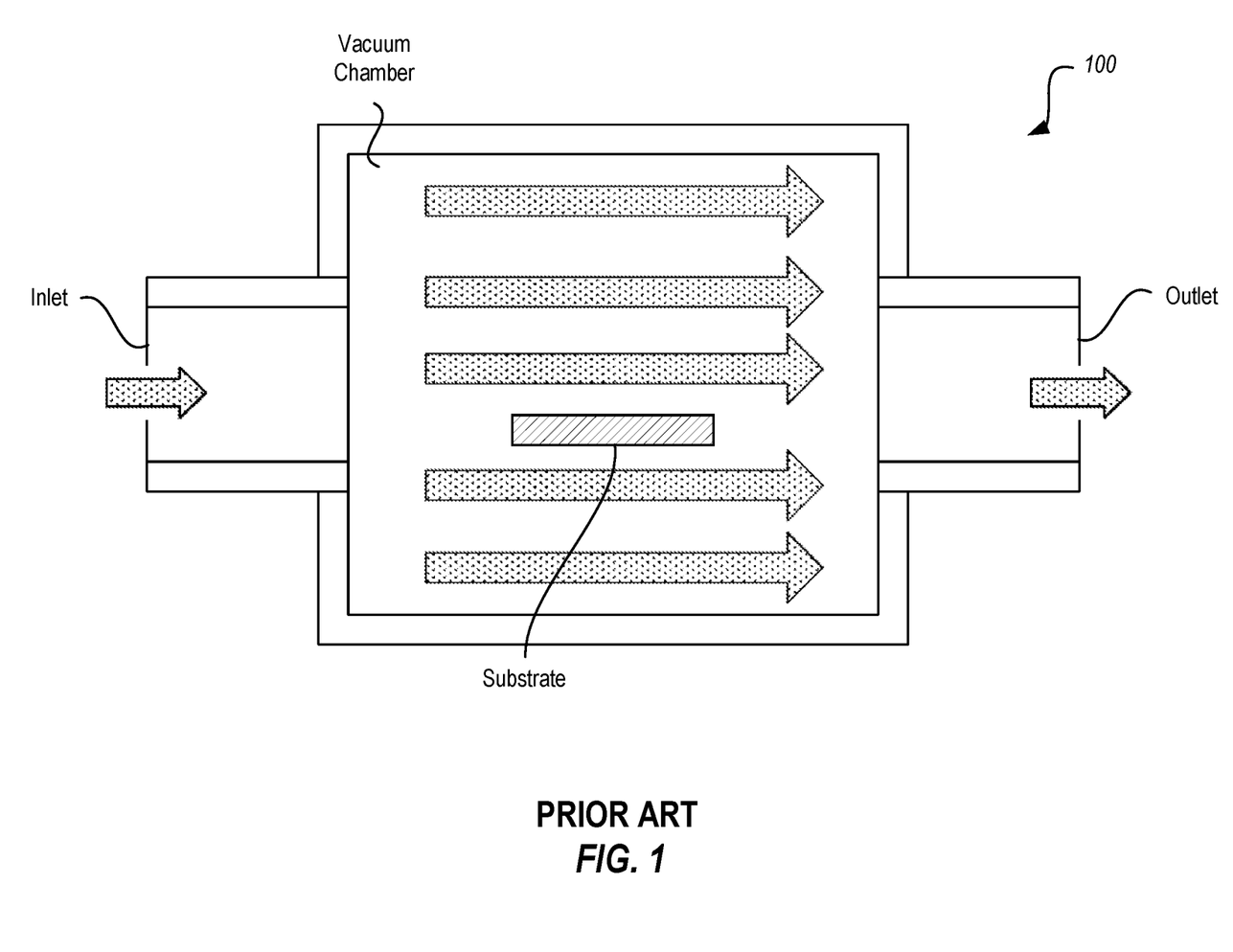
FIG. 1 illustrates a conventional temporal ALD environment.

Temporal ALD processing, as represented by the environment 100 shown in FIG. 1, requires a target product (e.g., a substrate) to be positioned within a vacuum sealed reaction chamber. Then, gaseous reactants (i.e., precursors) are introduced into the reaction chamber alternately, one at a time. As the different precursors are pulsed into the reaction chamber, they saturate the surface of the product/substrate and cause a surface chemical reaction with each other. These surface chemical reactions form/grow a film at the surface of the product comprising one or more monolayers of material with a controlled atomic granularity. This resulting film can also be grown in thickness and complexity by generating more monolayers of material from cycling more precursors through the reaction chamber.

To avoid any undesired gas phase reactions within the reaction chamber during the ALD process, the chamber is purged between each precursor pulse by an inert gas (e.g., nitrogen), thereby limiting the chemical reactions to only the surface chemical reactions that are needed to grow the film.

While ALD processes boast superior results for growing film of perfect conformality and uniformity of thickness, there is still a need and desire to improve upon the manner in which ALD is performed. For instance, temporal ALD k somewhat time intensive, particularly when growing films that require many different cycles and, even more particularly, when considering that each cycle includes several distinct phases that can each take several seconds (e.g., phase 1—pulse of precursor 1, phase 2—purge with inert gas, phase 3—pulse of precursor 2, phase 4—purge with inert gas, etc.).

Additionally, temporal ALD processes require product to be entirely positioned within the sealed reaction chambers of the ALDS device during processing, even when it is not necessary and/or desired to grow the film on certain portions of the product being treated. Accordingly, in such instances, it is necessary to first mask the product so that only the targeted area(s) will be exposed to the chemical precursors. Masking processes are somewhat cumbersome and can introduce undesired manufacturing costs and delays associated with performing ALD processing.

Many temporal ALD reaction chambers are also relatively small, such that temporal ALD processes are not suitable for applying films to large surfaces (e.g., large screens and rolls of material).

Spatial Atomic Layer Deposition, the second conventional type of ALD, relies on a spatial separation of precursor exposures instead of the temporal separation required by the temporal ALD processes mentioned above. For instance, during spatial ALD, a product is positioned on a conveyor or movable table that runs under an assembly of spatially separated precursor zones, as generally shown by the assembly 210 of spatial ALD environment 200 of FIG. 2.

Figure 2:
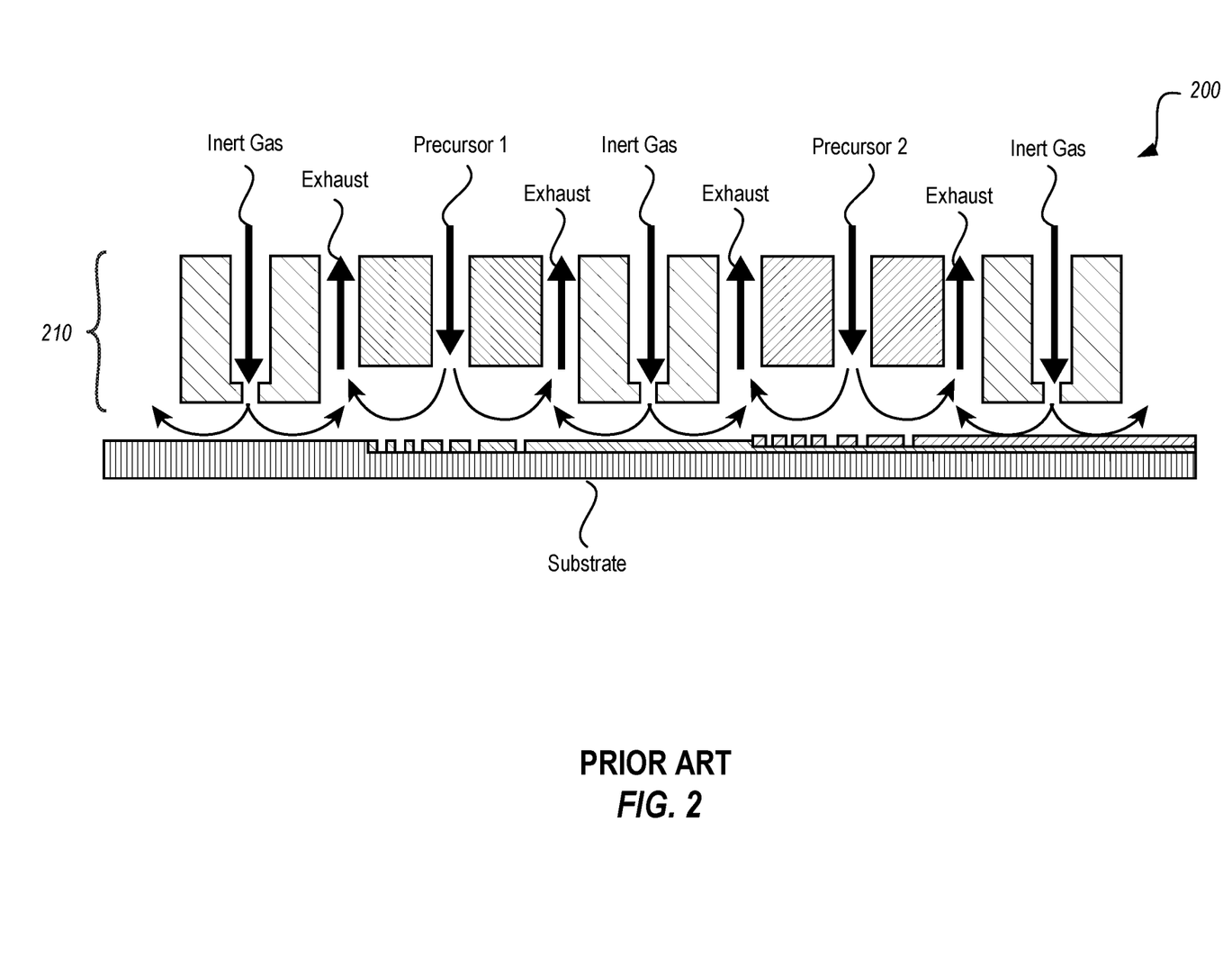
FIG. 2 illustrates a conventional spatial ALD environment.

In FIG. 2, as the substrate is moved from left to right, a first precursor is applied to the substrate, followed by a subsequent application by a second precursor that reacts with the first precursor deposition on the surface of the substrate to initiate a surface chemical reaction and to grow/generate a desired monolayer film of material on the substrate. It will be noted that while only two precursor zones are shown, a spatial ALD assembly may include three or more different precursor zones.

Beneficially, and unlike temporal ALD, which requires that precursors are applied in discrete temporal cycles, spatial ALD allows each/all of the precursors to be applied at the same time, albeit at different locations along the assembly, and which are still applied sequentially as the target product is moved beneath the ALD assembly. The simultaneous application of the different precursors enables spatial ALD to grow a film on a product more quickly than is possible with temporal ALD. The separation of the different precursor zones along the spatial ALD assembly also enables the spatial ALD process to be applied to large surface areas (e.g., large screens and/or rolls of material for flexible electronics, such as photovoltaics, OLED lighting and displays, etc.).

Unfortunately, as in temporal ALD processing, spatial ALD processes may still require masking, unless a user desires to treat the entire surface of the product being treated, particularly since the different precursor zones of conventional spatial ALD devices are configured to saturate the entire surface width of the underlying substrates as those substrates are conveyed through the different ALD assembly zones.

Additionally, while a spatial ALD assembly can theoretically include any number of different precursor zones, there is an actual practical limit to the number of zones that can be utilized, as each zone must be spatially offset. Accordingly, when many different ALD cycles are required to generate a desired film composition, spatial ALD processing may not be a suitable, even if the film only requires two or a very few number of precursors, as the many different spatially offset zones will take up too much space and cost too much to build into a single machine.

In view of the foregoing, there is an ongoing need and desired for improved ALD systems and processes, and particularly for facilitating targeted ALD processing.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Targeted temporal ALD systems and techniques are provided for facilitating the application and utility of ALD processes in a targeted and controlled manner.

Disclosed embodiments include targeted temporal ALD devices having an ALD head that includes: (i) an outer housing; (ii) an inner housing positioned within the outer housing, the inner housing defining an inner chamber, with an outer chamber being formed between the inner housing and the outer housing; and (ii) a plurality of ports formed into the inner housing and outer housing for fluidly connecting at least one precursor gas source and at least one inert gas source to the ALD head and the corresponding inner and/or outer chambers, as described herein.

The referenced ports include inlet ports and outlet ports and comprise both (i) a first set of one or more ports for enabling fluid communication between the inner housing and the at least one precursor gas source, the first set of one or more ports being formed through both the outer housing and the inner housing, bypassing the outer chamber, for enabling the at least one precursor gas to flow into and out of the inner chamber during use, while bypassing the outer chamber, and (ii) a second set of one or more ports formed through the outer housing, without being formed through the inner housing, for enabling fluid communication between at least one inert gas and the outer chamber during use.

The ALD head configurations facilitate, in some instances, targeted and controlled ALD processes to discrete targeted areas of one or more products/substrates that are positioned on one or more mounting surface(s) of the targeted temporal ALD device(s).

During use, for example, precursor gases are applied to targeted areas of products/substrates from an inner chamber in the inner housing, while inert gases are applied to an outer chamber between the inner and outer housings to limit and/or control application of the precursor gases to the desired target areas, while refraining from applying the precursor gases to product areas other than the desired target areas.

Some disclosed targeted temporal ALD devices are also configured to position/reposition the ALD head in three orthogonal directions relative to the product(s)/mounting surface(s). For instance, some targeted temporal ALD devices are configured with a substrate mounting surface as well as adjustment means for selectively changing and securing a positioning of the ALD head relative to the substrate mounting surface during use.

Some targeted temporal ALD embodiments also include positioning controls for controlling the adjustment means for selectively changing and securing a positioning of the ALD head relative to the substrate mounting surface. The positioning controls, for example, enable selective positioning of the ALD head relative to one or more substrates positioned on the substrate mounting surface to be adjacent to the inner chamber of the ALD head and within a predetermined distance from terminating ends of the inner and outer housings of the ALD head during use.

Some targeted temporal ALD embodiments also include flow controls for (1) controlling a flow of one or more precursor gases from one or more precursor sources into and out of the inner chamber, for (2) controlling a flow of one or more inert gases from one or more inert gas sources into and out of the outer chamber and/or for (3) controlling a flow of the one or more inert gases from the one or more inert gas sources into and out of the inner chamber.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

As mentioned above, the disclosed embodiments are directed to targeted temporal ALD systems and techniques for facilitating the application and utility of ALD processing in a targeted and controlled manner.

Disclosed embodiments include both the targeted temporal ALD devices, as well as the manufacturing processes performed by the disclosed targeted temporal ALD devices. The disclosed embodiments also include the computing systems and storage devices storing computer-executable instructions for performing the disclosed manufacturing processes and/or for controlling the disclosed targeted temporal ALD devices described herein.

The disclosed targeted temporal ALD devices include an ALD head that is configured to perform targeted ALD to discrete/targeted areas of a product, without requiring any masking and/or at least without requiring as much masking as is typically required for conventional ALD processing to prevent exposure of the precursor gases to certain non-targeted areas of the treated product. The disclosed targeted temporal ALD processes and devices also enable the application of multiple ALD cycles to a particular target area without requiring a product having the target area to be contained entirely within a sealed reaction chamber during the ALD processing cycles (as required for conventional temporal ALD processing) and also without requiring a spatially separate precursor zone for each of the different precursor phases that are applied during a multi-phase ALD processing cycle, for example, (as required for conventional spatial ALD processing).

The ALD head of the disclosed targeted temporal ALD devices is movable in at least three different directions relative to the product/mounting surface for facilitating the targeted and controlled application of the precursors to target areas of the target product.

The foregoing functionalities and features of the disclosed targeted temporal ALD devices, systems and method represent a significant improvement over existing temporal and spatial ALD technologies and can be utilized to save time and costs associated with performing ALD processes, particularly targeted ALD processes. These disclosed embodiments can also be particularly suitable for growing very complex film structures that require many different precursors and/or deposition cycles.

Figure 3A:
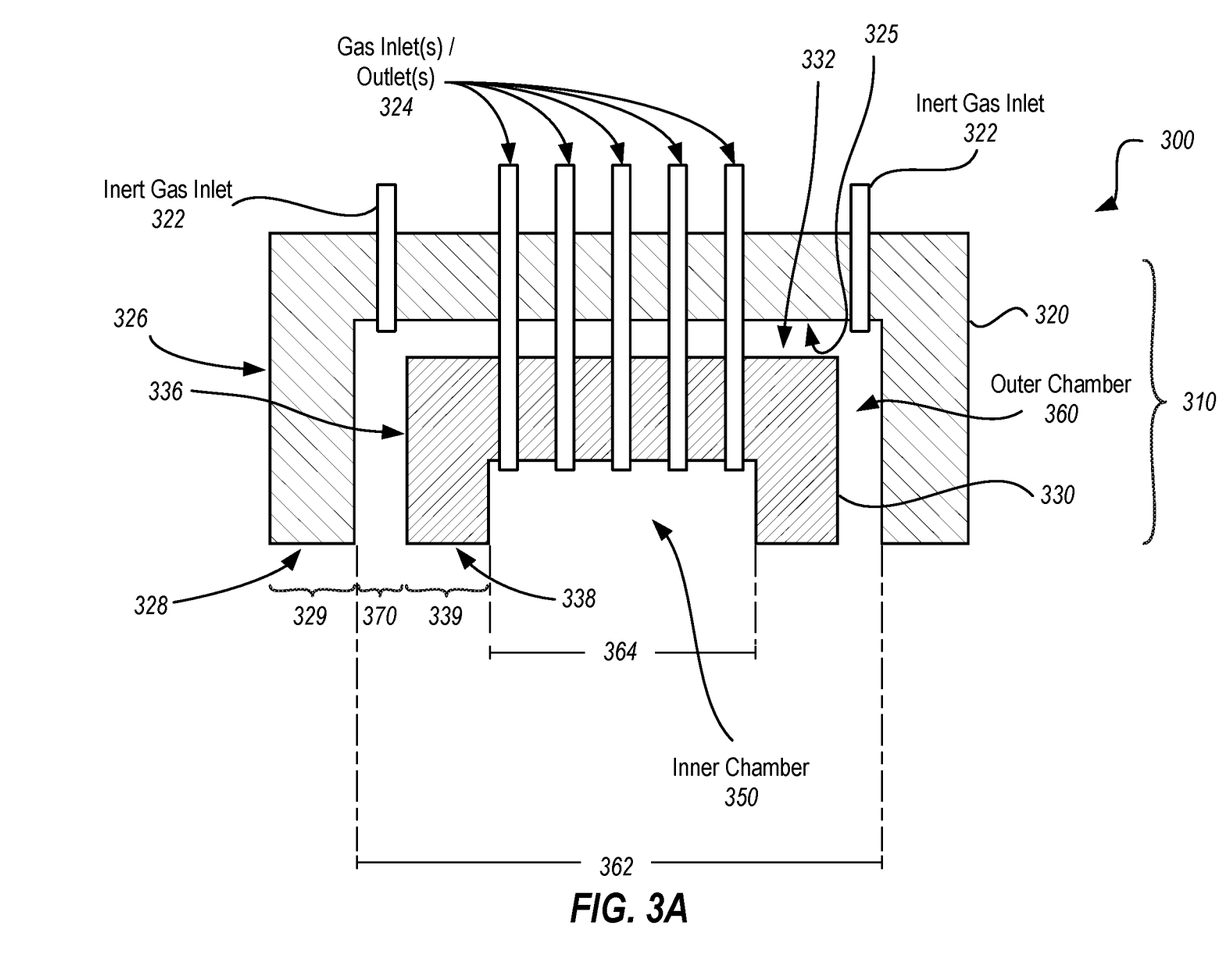
FIGS. 3A-3C illustrate components of a targeted temporal ALD device, including an ALD head that comprises an inner housing and an outer housing with ports formed therethrough for enabling the fluid passage of precursor and inert gases and that can be used for facilitating the targeted temporal ALD processing described herein.
Figure 3B:
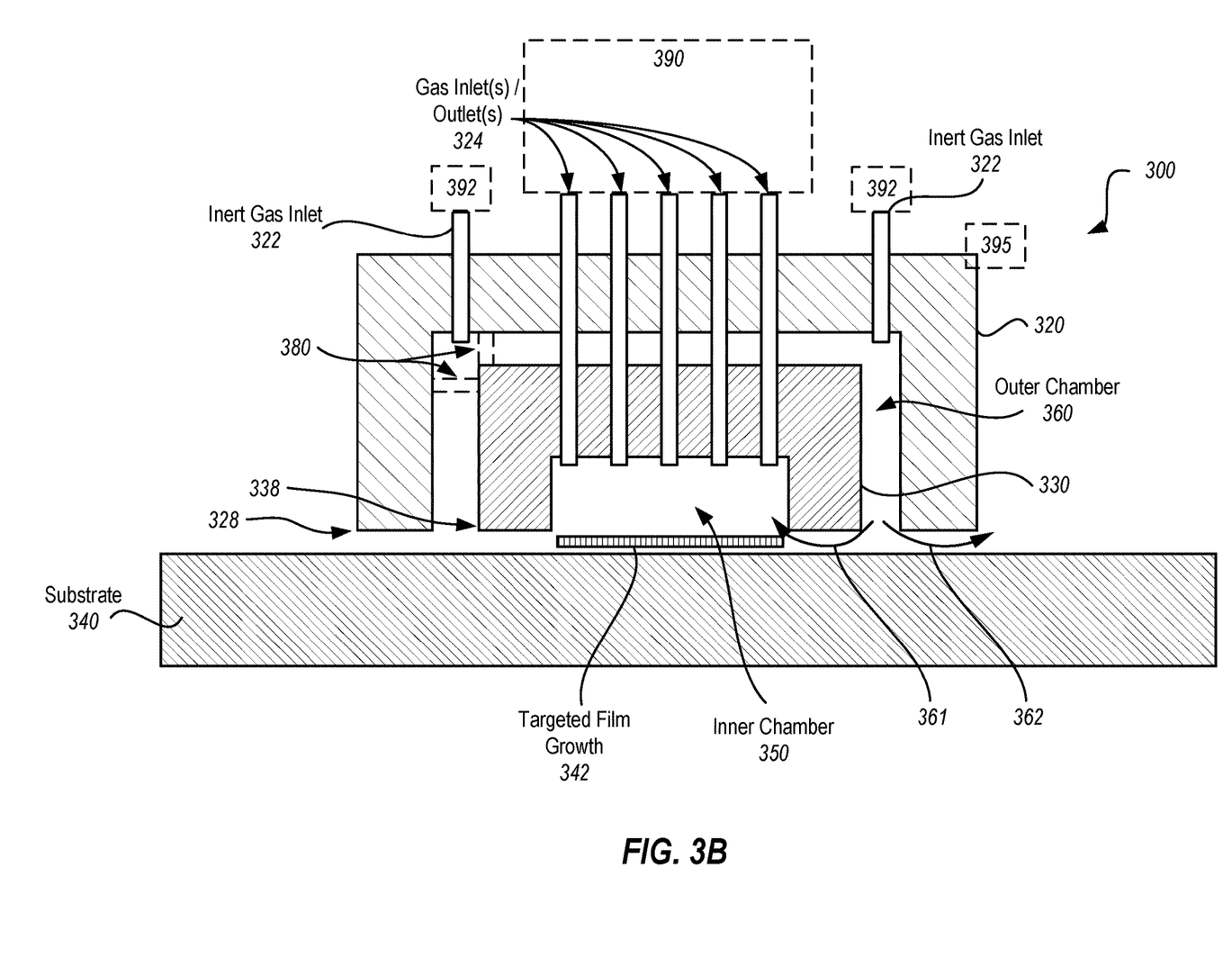
Figure 3C:
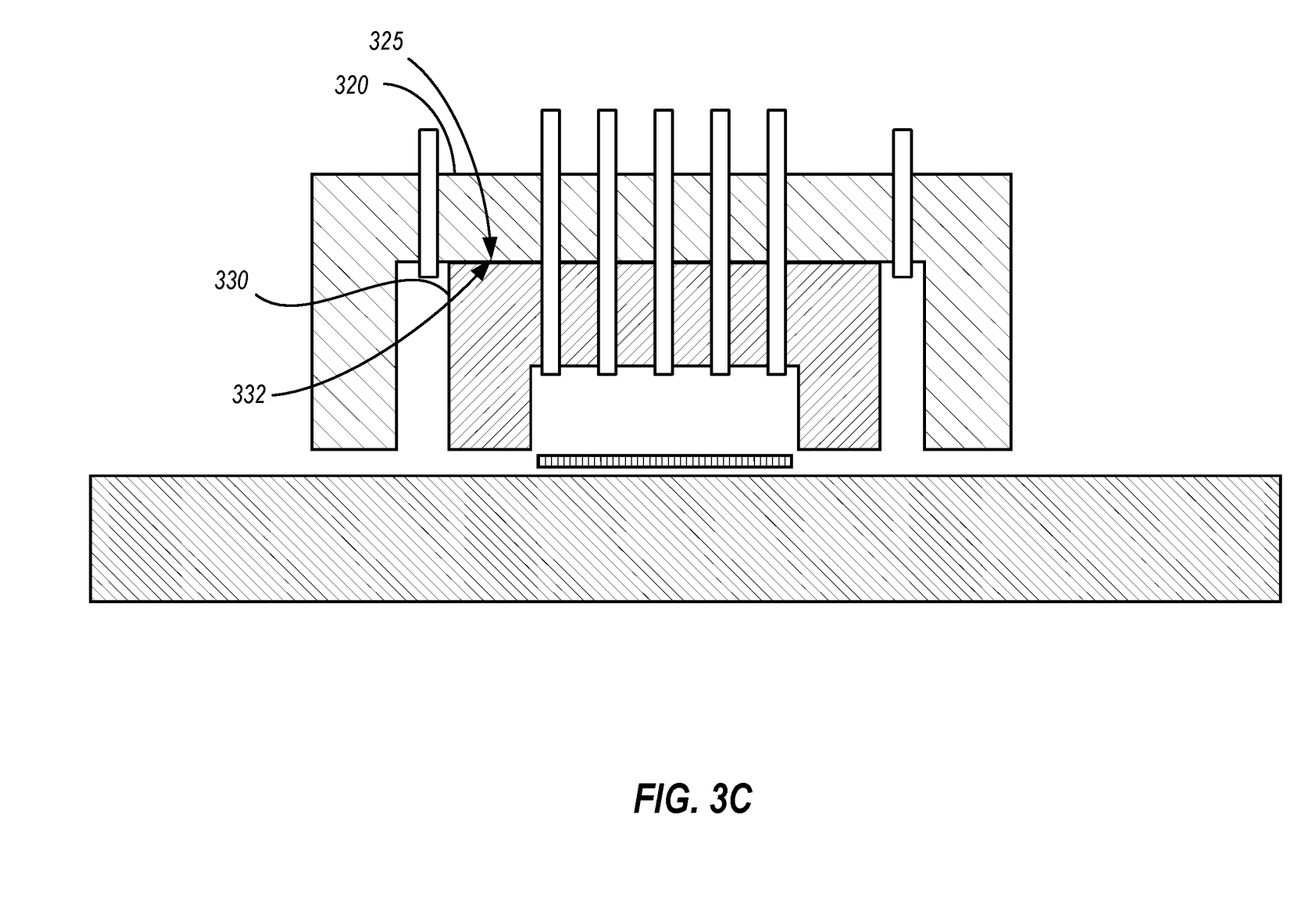

Attention will now be directed to FIGS. 3A-3C, which illustrate cut-away side views of exemplary embodiments (300) of an ALD head 310 that is configured for use in generating targeted and controlled film growth 342 (FIG. 3B) on a targeted area of a substrate 340 or other target product without exposing the non-targeted regions of the product/substrate to the precursor gases that are used to grow the film.

As shown in FIGS. 3a-3C, for example, an ALD head 310 includes an outer housing 320 and an inner housing 330, with numerous ports formed therethrough, for enabling fluid communication of gases through the inner and outer housing structures.

In some instances, the referenced ports are referred to as inlet ports, outlet ports, or more simply as inlets and outlets, with the directional titles suggesting a directionality of fluid flow through the ports. However, the suggested directionality is not always required for all embodiments. In particular, in some alternative embodiments, it is also possible for the inlet and outlet ports to permit alternating bi-directional flow, during the different phases of use, such that the functionality of multiple ports can be combined through a single port, for example. Accordingly, in such instances, the references to inlet and outlet are not necessarily limited to a singular suggested directionality of flow through the referenced port.

It will be appreciated that the referenced ports include the openings/holes that are formed in and through the inner/outer housing structures. The referenced ports also include, in some embodiments, one or more valves, tubes, seals or other fluid containment components (although not specifically shown) that may be used to facilitate controlled flow of the referenced gases through the inner/outer housings and into/out of the referenced inner/outer chambers during the referenced targeted temporal ALD processes.

In some instances, the ports include all of the fluid containment components existing between the inner/outer chambers and the corresponding inert/precursor gas source(s) that supply the inert/precursor gases to the ALD head during use through the corresponding port(s). These fluid containment components are not specifically shown, as they are known to those of skill in the art. These fluid containment components may also be included in the gas source references (390 and 392), shown in FIG. 3B.

According to some embodiments, the ports include at least a first set of one or more ports (e.g., gas inlet(s)/outlet(s) 324) for enabling fluid communication between the inner housing and one or more different precursor gas sources, from one or more precursor gas sources 390 (FIG. 3B). The first set of one or more ports is formed through both the outer housing 320 and the inner housing 330, bypassing the outer chamber 360, for enabling the at least one precursor gas to flow into and out of the inner chamber 350 during use, while bypassing the outer chamber 360 (e.g., without allowing the precursor gas to enter into in the outer chamber 360 when it is passed between the outer housing 320 and the inner chamber 350.

In some embodiments, the ports also include at least a second set of one or more ports (e.g., inert gas inlet(s) 322) formed through the outer housing 320, without being formed through the inner housing 330, for enabling fluid communication between at least one inert gas, from one or more inert gas sources 392 (FIG. 3B), and the outer chamber during use.

The inert gas introduced into the outer chamber 360 during use will maintain a desired flow (shown by arrows 361 and 362) for offsetting any pressure/flow of precursor gases in the inner chamber 350 and to prevent any of those precursor gases from escaping out of the inner chamber 350 during use, even when the precursor gases are injected into the inner chamber 350. Even more particularly, the offsetting pressure created by injecting inert gas into the outer chamber through ports 342 helps prevent precursor gases from flowing outwardly between any space that exists between the terminating end 338 of the inner housing 330 and the substrate being treated during use (See FIG. 3B). In this manner, it is possible to limit the application of the precursor gases to only targeted regions of the substrate directly beneath the inner chamber and for controllably generating targeted film growth on the substrate.

It will be appreciated that the offsetting pressure created in the outer chamber 360, created by introducing inert gas into the outer chamber 360, can be controlled to cause no flow of gas out of the inner chamber 350 (even when precursors are introduced through the ports 324 into the inner chamber 350). This effectively creates and/or maintains a vacuum seal in the inner chamber during use.

In some embodiments, the offsetting pressure in the outer chamber is greater than a pressure in the inner chamber, so as to allow only a small amount of inert gas to flow into the inner chamber from the outer chamber, as shown by arrow 361.

The pressures in the outer chamber and the inner chamber are measured and controlled with sensors, valves, pumps and other flow controls that are configured for (1) controlling a flow of one or more precursor gases from one or more precursor sources into and out of the inner chamber, for (2) controlling a flow of one or more inert gases from one or more inert gas sources into and out of the outer chamber and/or for (3) controlling a flow of the one or more inert gases from the one or more inert gas sources into and out of the inner chamber.

The referenced flow controls, which are also abstractly reference by the gas source references 390, 392) include any combination of (i) one or more sensors and/or timers that are operable to detect a flow of the one or more inert and/or precursor gases into and out of the inner chamber and/or the outer chamber, as well as the pressures in the inner/outer chambers, (ii) one or more valves and/or pumps that are operable to selectively control the flow of the one or more inert and/or precursor gases into and out of the inner chamber and/or the outer chamber, (iii) one or more processors and computer-executable instructions that are executable by the one or more processors to process sensor data received from the sensors and to control operation of the sensors, valves and/or pumps based on the sensor data.

Flow controls, as mentioned above, are well-known to those of skill in the art and are not, therefore described in detail or shown in detail in the drawings and this is not necessary to enable one of skill in the art to incorporate such flow controls to the described targeted temporal ALD devices of the current invention, such as by connecting the flow controls to ports 324 and 392, for example.

It will be noted that the outer housing of the ALD head 310 includes a top 325 and an outer chamber body wall 326 that extends away from the top of the outer housing (325) to a terminating end 328 which surrounds and defines a perimeter 362 of the outer chamber 360. The outer chamber 360 is encompassed within the outer housing 320 and positioned between the outer housing 320 and the inner housing 330.

The inner housing of the ALD head 310 also includes a top 332 and an inner chamber body wall 336 extends away from the top of the inner housing (332) to a terminating end 338 that surrounds and defines a perimeter 364 of the inner chamber 360 that is encompassed within the inner housing 330.

It will be appreciated that the terminating ends 328, 338 can have a square or edged profile shape, as shown, and/or they can also comprise other shape profiles (not shown), such as a rounded, inwardly tapered, or outwardly tapered profile shape. The different shapes can facilitate maintaining desired pressure states and flows of gases for the inner chamber and/or outer chamber.

Figure 4:
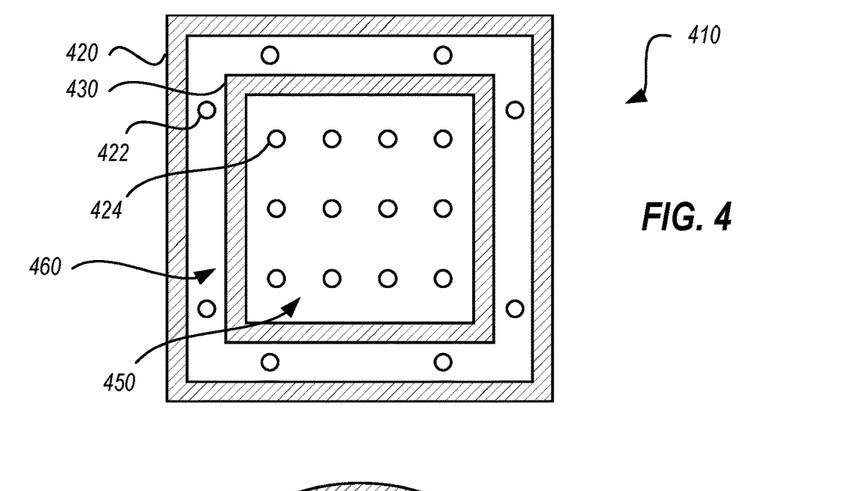
FIGS. 4-6 illustrate non-limiting examples of a cut-away view of ALD heads comprising inner and outer housings with different configurations of ports formed therethrough for enabling the fluid passage of precursor and inert gases and that can be used for facilitating the targeted temporal ALD processing described herein.
Figure 5:
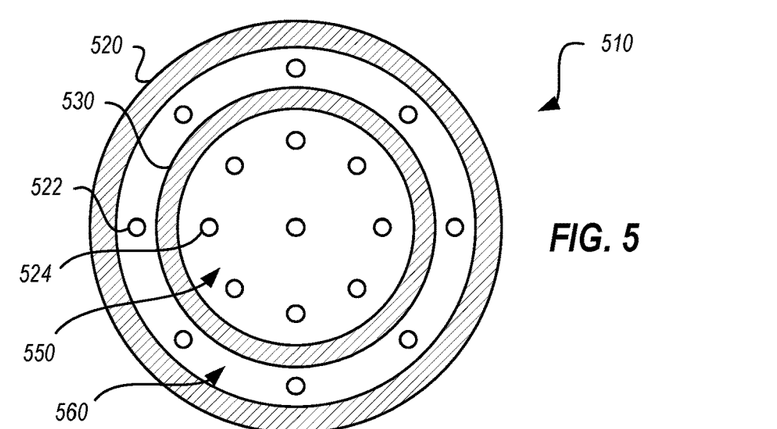
Figure 6:
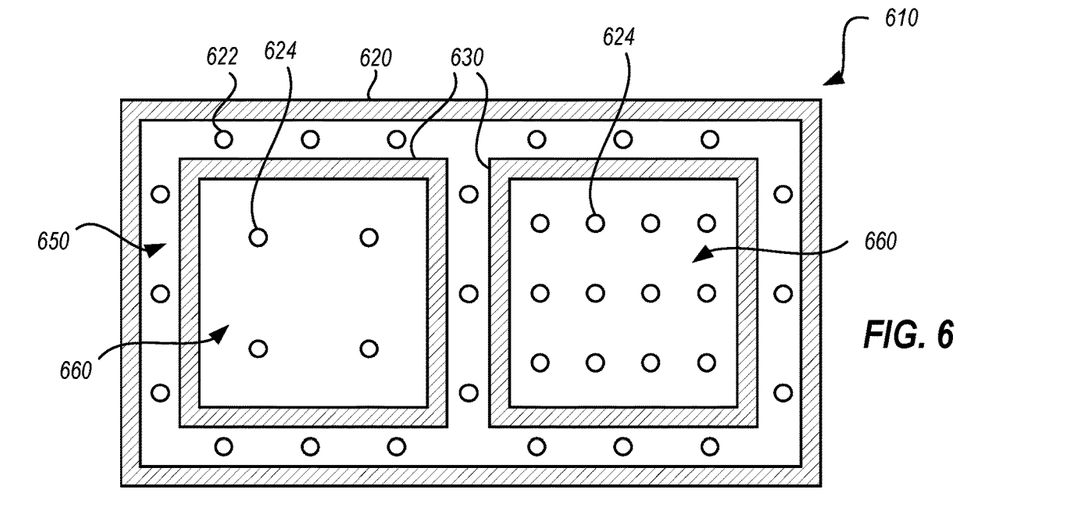

It will also be appreciated that the perimeters 362, 364 of the outer and inner chambers, respectively, can have different circumferential shapes (e.g., square, rectangular, oval, circular, or any other regular or even irregular shape). Different non-limiting examples of various shapes (squares and circles) that can be used for the perimeters of the outer housings (420, 520, 620) and inner housings (430, 530, 630), for example, are shown in FIGS. 4-6.

The configurations of the inner and outer housings may also include the positioning of 2 or more inner housings (630) within a single outer housing (620), for example, any number of 2, 3, 4, 5 or more inner housings may be contained within a single outer housing to accommodate different needs and preferences, such as for enabling the growth of different material films (of a same or different composition) within the same ALD head and/or at a same time during the ALD processing.

In these embodiments (FIGS. 4-6), the ALD heads 410, 510, 610 can also be configured with different combinations of the ports (422, 522, 622) in fluid communication with the outer chamber (460, 560, 660) and ports (424, 524, 624) in fluid communication with the inner chamber (450, 550, 650).

The different combinations/configurations of ports can facilitate desired distributions and flow of the precursor/inert gases to accommodate different needs and preferences. In some instances, although not required, each different precursor gas will have its own dedicated port connected to the inner chamber. In some embodiments, multiple ports are used in the inner chamber to supply a same set of one or more precursor gas(es).

In some embodiments, some ports are dedicated to inlet flows, while other ports are dedicated to outlet flows. In some instances, ports connected to the inner housing are only used for inlet flows for precursor gases and for outlet flows of both precursor gases and inert gases. In other instances, ports connected to the inner housing are used for inlet flows of both precursor and inert gas flows as well as for outlet flows of both precursor gases and inert gases. The ports connected to the outer housing are generally only used for inlet flows of precursor gases. However, they can also be used as outlet ports for inert and precursor gases, when desired.

The quantity of ports used for inlet ports and/or outlet ports for the inner housing and outer housing can be the same or different. In some instances, the ports in fluid connection to the inner housing number (1, 2, 3, 4, 5, 6 or more). Likewise, the ports in fluid connection to the inner housing number (1, 2, 3, 4, 5, 6 or more).

The different ports can have the same and/or different sized diameters, as well as the same and/or different shaped openings, to provide for different desired flow properties into and out of the inner and outer chambers. In some instances, the diameter of each of one or more of the ports is less than 1 millimeter. Other instances, the diameter of each of the one or more of the ports is greater than 1 millimeter.

The general cross-sectional shapes of the areas defined/bounded by the inner housing perimeters may be the same or different than the general cross-sectional shapes of the areas defined/bounded by the outer housing perimeters. The different perimeter shapes can facilitate targeting different limited/shaped portions of substrates and other products undergoing the targeted temporal ALD processes described herein. The area bounded by each inner perimeter contained within the outer perimeter is less than the overall area bounded by the outer perimeter. The bounded area of the inner housing can vary to accommodate different needs and preferences. In some embodiments, the bounded area of the inner perimeter is between 4 cm$^2$ and 600 cm$^2$. In other embodiments, the bounded area of the inner perimeter is less than 4 cm$^2$ or greater than 600 cm$^2$.

The thickness (339) of the inner chamber wall 326 and the thickness (328) of the outer chamber walls (326, 336) may be the same or different. Each wall may have a thickness that is designed to accommodate different needs and preferences (e.g., different tolerances for creating different desired flows of gases and vacuum seals during use). In some instances, the thickness of each wall will be in a range of less than a millimeter, to a thickness of many millimeters (e.g., 2, 3, 4, 5 or more, even to a centimeter or more).

Likewise, the thickness of the of the space or thickness (370) of the outer chamber 360 may also vary to accommodate different needs and preferences, from a thickness of less than a millimeter, to a thickness of one or more millimeters in thickness (e.g., 2, 3, 4, 5 or more, even to a centimeter or more).

The inner housing and the outer housings can be composed of any suitable material, including, but not limited to steel, aluminum, alloys, ceramics, plastics, composites and/or any other material. In some instances, the material composition of the inner housing and/or outer housing is a material that is heat conductive to enable the controlled heating of the inner chamber, for example, with a controllable heating element connected to the inner chamber (not shown), or a resistance heater element embedded in the inner housing (not shown, but which can be electrically connected and controlled with one or more power supply and control units integrated into the ALD device(s) described herein).

In some embodiments, the terminating ends 328 and 338 are in substantially coplanar alignment, such that they will be positioned a same relative distance from the substrate mounting surface/substrate 340 during use (e.g., such that they both terminate a same relative distance away from the top of the outer housing). In alternative embodiments, the terminating end 338 of the inner housing 330 terminates at a further distance, or alternately a less distance, away from the top of the outer housing than the terminating end 328 of the outer housing 330 does (not shown), and so as to be closer or further from the substrate than the terminating end 328 of the outer housing is, respectively, during use.

In some instances, the outer chamber 360 is expansively contained between the outer chamber body wall 326 of the outer housing 320 and the outer housing wall 336 of the inner housing 330, as well as between the top 332 of the inner housing 330 and the top 325 of the outer housing 320 (See FIGS. 3A and 3B).

In other instances, the outer chamber 360 is more constrained to only the space contained between the outer chamber body wall 326 of the outer housing 320 and the outer housing wall 336 of the inner housing 330. In this embodiment, the outer chamber does not extend between the tops of the inner/outer housings, such as, for example, as shown in FIG. 3C, when the top 332 of the inner housing 330 is in direct contact with the top 325 of the outer housing 320. This embodiment is useful for maintaining the inner housing secured to the outer housing in a fixed position relative to the outer housing. Alternatively, one or more pins, braces, or other support structures 380 (FIG. 3B) can be used to maintain the inner housing secured to the outer housing in a fixed position relative to the outer housing.

In some alternative embodiments, the support structures 380 comprise controllably movable pistons for moving the inner housing to a desired location within the outer housing before, during and/or after use.

Similarly, the ALD head can be moved, in its entirety by the disclosed targeted temporal ALD devices with adjustment means and positioning controls, collectively referenced as element 395 in FIG. 3, which will be described in more detail below with reference to FIGS. 7-8.

Figure 7:
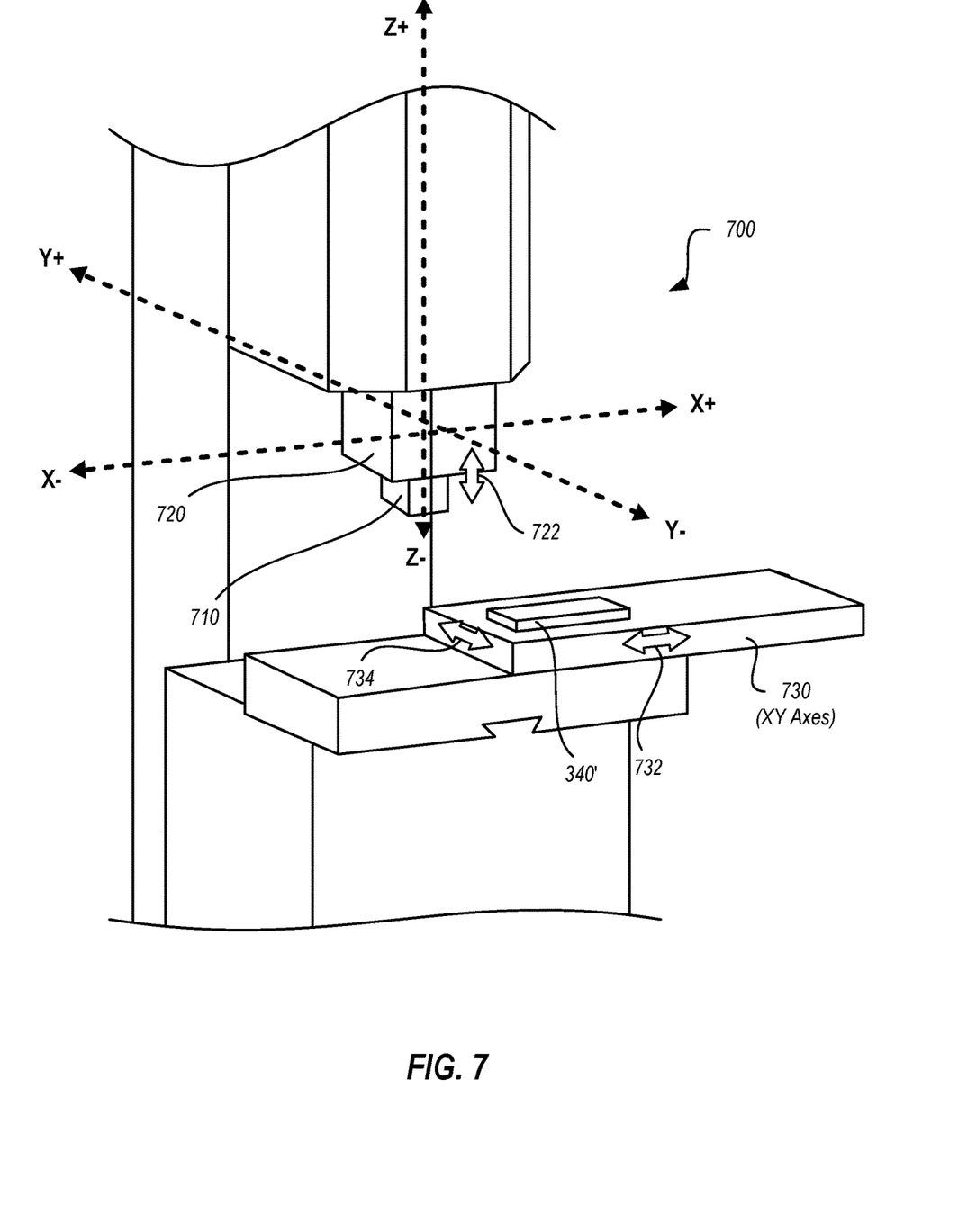
FIGS. 7-8 illustrate non-limiting examples of the disclosed ALD head being positioned controllably in at least three orthogonal directions, relative to positioning of a substrate/product mounting surface and/or the substrate/product mounted thereon.
Figure 8:
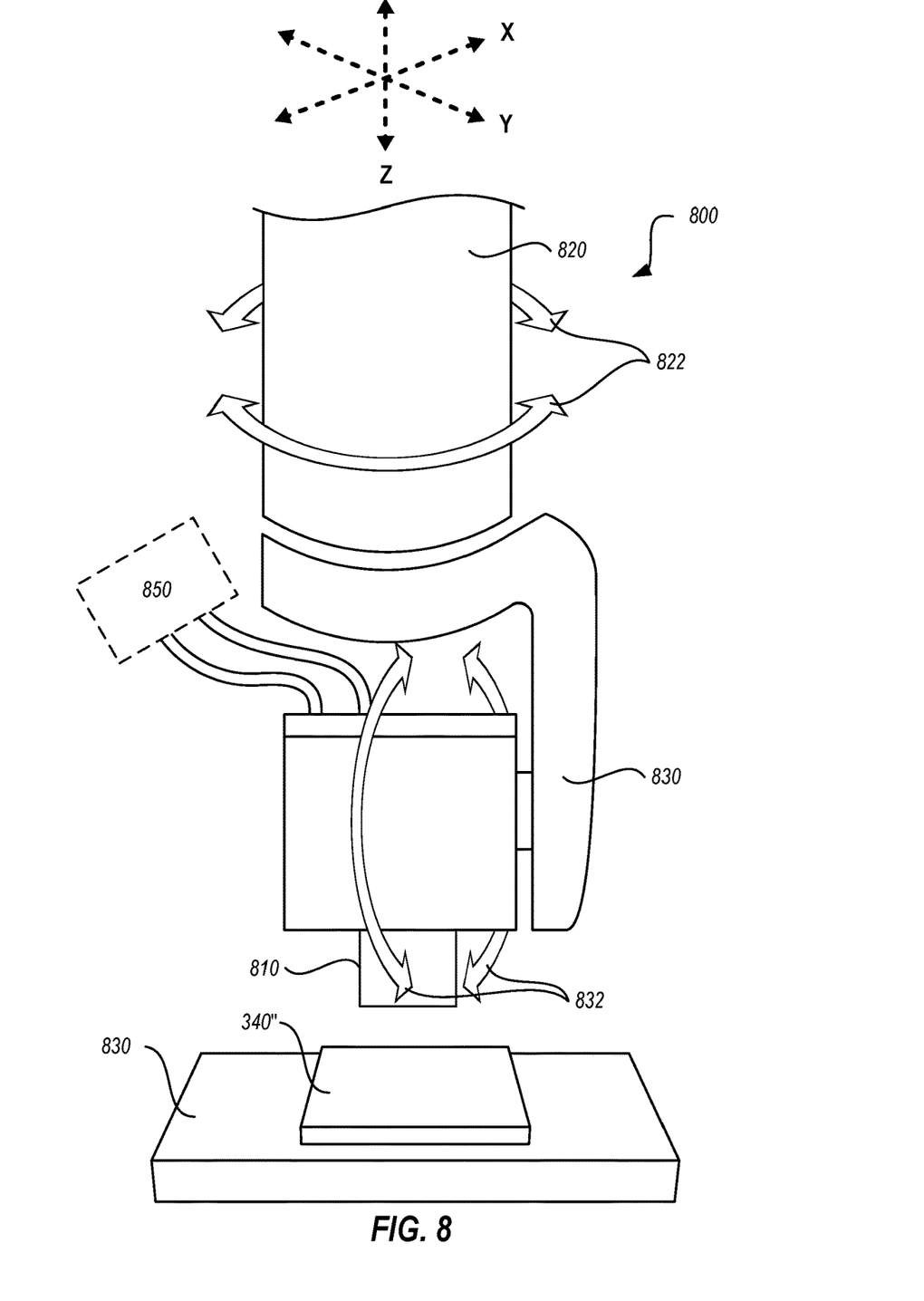

As shown in FIGS. 7-8, the targeted temporal ALD devices include a substrate mounting surface (e.g., 730, 830) configured to mount a substrate (e.g., 340, 340', 340"), as well as adjustment means for selectively changing and securing a positioning of the ALD head (710, 810), relative to the substrate/substrate mounting surface during use. The ALD heads 710 and 810 are similarly configured to those described in FIGS. 3A-3C and/or FIGS. 4-7.

The adjustment means for selectively changing and securing the positioning of the ALD head(s) include any combination of pneumatic pistons, hydraulic pistons, electrical solenoids, electric motors, electric spindles, gears, belts and/or other structures that are operable either individually or collectively to position and/or reposition the ALD head and/or substrate mounting surface, relative to each other, in at least three different orthogonal directions.

In the example of FIG. 7, the targeted temporal ALD device 700 includes an adjustment means comprising a movable table (which includes or secures a substrate mounting surface 730) that is operable to be moved in two horizontal and orthogonal directions (along XY Axes, for example), as well as a control piston 720 that the ALD head 710 is connected to for moving the head along a Z axis. Such movable tables and pistons are known to those of skill in the art and are not, therefore, described in more detail herein.

In the example of FIG. 8, the ALD head 810 is connected to a rotor/spindle of a head mount 830 that enables rotation around a first axis (X and/or Y axis). The head mount 830 is connected to an arm 820 and is independently rotatable about a second axis (Z-axis). The arm 820 is also movable in one or more directions of movement along the X-axis, Y-axis and/or Z-axis. Such mobility for a tool held by the head mount utilized by 5-axis machines (e.g., a 5-axis CNC machine). Since such mobility of a machine is known, it will not be described in more detail at this time.

Combinations of the foregoing can also be used, such as by providing a movable table (e.g., substrate mounting surface 830), to facilitate conveyor type operations in which one or more substrates are conveyed below the movable ALD head between and/or during use (e.g., during creation of the targeted film growth).

Although not shown, the targeted temporal ALD devices 700 and 800 also include the other ALD components described and referenced above (e.g., flow controls), operably connected to the ALD head and/or connected to the adjustment means. The referenced targeted temporal ALD devices 700 and 800 also include positioning controls (e.g., for controlling the adjustment means for selectively changing and securing a positioning of the ALD head relative to the substrate mounting surface.

The positioning controls, for example, enable selective positioning of the ALD head relative to one or more substrates positioned on the substrate mounting surface to be adjacent to the inner chamber of the ALD head and within a predetermined distance from terminating ends of the inner and outer housings of the ALD head during use, whether the substrate mounting surface is moving or not moving during positioning of the ALD head, to facilitate positioning before and/or during the ALD deposition cycles.

These positioning controls include any combination of proximity sensors for sensing a proximity of the ALD head relative to the substrate mounting surface or a substrate mounted thereon, as well as one or more processors and computer-executable instructions that are executable by the one or more processors for interfacing with the sensors, for processing sensor data and for controlling the adjustment means for positioning and repositioning the ALD head and/or substrate mounting surface based on the sensor data.

As previously mentioned, the targeted temporal ALD processing with the disclosed targeted temporal ALD devices (e.g., disclosed ALD heads and devices containing the disclosed ALD heads) may include one or more cycles in which one or more different precursor gases are introduced and expelled into and out of the inner chamber of the ALD head through ports connected to the inner chamber, while preventing the precursor gases from leaking beyond the targeted area adjacent to the inner chamber, as a result of the inert gas flowing into the outer chamber (with ports connected to the outer chamber) and that creates an effective vacuum seal for the inner chamber during the ALD deposition processes. The ALD processes also include purging the inner chamber of the precursor gases between different phases of each ALD cycle with an inert gas that is introduced into the inner chamber from ports connected to the outer chamber and/or inner chamber.

The disclosed ALD processes may also include positioning the ALD head adjacent to the targeted area of the substrate and/or repositioning the ALD head from one position to a new targeted area, as well as for performing one or more ALD deposition cycles at each targeted area.

The ALD deposition cycles include (i) exposing the target area to a precursor by introducing the precursor into the inner chamber via the one or more inlet ports connected to the inner chamber (as previously discussed) and, at the same time, (ii) introducing an inert gas into the outer chamber via a different one or more inlet ports that are connected to the outer chamber, to create a vacuum seal within the inner chamber and proximate the targeted area (as also previously discussed), then (iii) purging the inner chamber, by evacuating the precursor through one or more outlet ports connected to the inner chamber, and which may be the same ports or different ports used to introduce the precursor into the inner chamber.

Then, the ALD head can remain in the same position or be repositioned adjacent to a new target area to perform a subsequent cycle. The subsequent cycle includes (i) exposing the target area to the same precursor used in the previous cycle and/or a different precursor, which is/are introduced into the inner chamber via one or more inlet ports connected to the inner chamber (the same or different set of one or more port(s) used in the previous cycle), and, at the same time, (ii) introducing an inert gas into the outer chamber with a different one or more inlet ports that are connected to the outer chamber, to create a vacuum seal within the inner chamber (proximate the targeted area), then (iii) purging the inner chamber (by evacuating the precursor(s) through one or more outlet ports connected to the inner chamber and which may be the same ports or different ports used to introduce the precursor(s) into the inner chamber.

Any number of cycles may be performed to grow and/or modify different layers of material at one or more target areas.

Notably, the foregoing embodiments have been specifically directed to the use of the ALD head(s) and targeted temporal ALD devices to perform targeted temporal ALD processes for growing film structures. It will be appreciated, however, that the ALD head(s) and targeted temporal ALD devices can also be used to perform controlled targeted etching of a product, by positioning/repositioning the described ALD head(s), for example, adjacent to one or more target area(s) of a surface to be etched and then exposing the target area(s) to one or more different vapors/gases that have a chemical composition that reacts with the target area to cause a degradation or etching of the surface at the target area(s). The etching processes may also be cycled, similar to the cycling performed for the ALD process cycles, with different and alternating precursor/purge phases.

These processes, as well as any of the other disclosed functionality may be practiced by a computer system including one or more processors and computer-readable media such as computer memory. In particular, the computer memory may store computer-executable instructions that when executed by one or more processors cause various functions to be performed, such as the acts recited in the embodiments.

In this regard, it will be appreciated that embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmission media can include a network and/or data links which can be used to carry program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A targeted temporal ALD (Atomic Layer Deposition) device comprising: an ALD head, the ALD head comprising:
   (i) an outer housing;
   (ii) an inner housing positioned within the outer housing, the inner housing defining an inner chamber, wherein the inner housing and the outer housing together define an outer chamber of space that surrounds the inner housing; and
   (iii) a plurality of ports formed into the inner housing and outer housing for connecting at least one precursor gas source to the inner chamber and at least one inert gas source to the outer chamber, the plurality of ports including:
      a. a first set of one or more ports for enabling fluid communication between the inner housing and the at least one precursor gas source, the first set of one or more ports being formed through both the outer housing and the inner housing, bypassing the outer chamber, for enabling the at least one precursor gas to flow into and out of the inner chamber during use, while bypassing the outer chamber, and
      b. a second set of one or more ports formed through the outer housing, without being formed through the inner housing, for enabling fluid communication between at least one inert gas source and the outer chamber of space that surrounds the inner housing during use and in such a manner the inert gas introduced into the outer chamber offsets any pressure of precursor gases in the inner chamber to prevent any precursor gases from escaping out of the inner chamber during use when the precursor gases are injected into the inner chamber.

2. The targeted temporal ALD of claim 1, wherein the targeted temporal ALD further comprising a substrate mounting surface and means for selectively changing and securing a positioning of the ALD head relative to the substrate mounting surface during use.

3. The targeted temporal ALD of claim 1, wherein the inner housing is secured to the outer housing in a fixed position relative to the outer housing.

4. The targeted temporal ALD of claim 1, wherein the first set of one or more ports comprises at least two or more ports.

5. The targeted temporal ALD of claim 1, wherein the first set of one or more ports comprises at least four ports.

6. The targeted temporal ALD of claim 1, wherein an inner perimeter of the inner chamber is defined by one or more sidewalls of the inner housing that surround the inner housing, the inner perimeter bounding an area that is greater than 4 cm2 and less than 600 cm2.

7. The targeted temporal ALD of claim 1, wherein sidewalls of the inner housing and the outer housing are separated by a space of at least 1 cm.

8. A targeted temporal ALD (Atomic Layer Deposition) device comprising: an ALD head, the ALD head comprising:
   (i) an outer housing, the outer housing comprising:
      a top of the outer housing, and
      an outer chamber body wall that surrounds and defines a perimeter of an outer chamber that is encompassed within the outer housing, the outer chamber body wall extending away from the top of the outer housing to a terminating end of the outer chamber body wall;
   (ii) an inner housing positioned within the outer housing, the inner housing comprising:
      a top of the inner housing, and
      an inner chamber body wall that surrounds and defines a perimeter of an inner chamber that is encompassed within the inner housing, the inner chamber body wall extending away from the top of the inner housing to a terminating end of the inner housing, wherein a space between the inner chamber body wall and the outer chamber body wall defines at least a portion of the outer chamber, wherein the space between the inner chamber body wall and the outer chamber body wall that defines at least the portion of the outer chamber surrounds the inner chamber body wall;
   (iii) a first set of one or more ports for enabling fluid communication between the inner housing and at least one precursor gas source, the first set of one or more ports being formed through both the outer housing and the inner housing, bypassing the outer chamber, for enabling the at least one precursor gas to flow into and out of the inner chamber during use, while bypassing the outer chamber, each port of the first set of one or more ports being in fluid communication with the inner chamber, the inner chamber defined by a space between the inner chamber body walls and between the terminating ends of the inner chamber body walls and the first set of one or more ports that open into the inner chamber; and
   (iv) a second set of one or more ports formed through the outer housing, without being formed through the inner housing, for enabling fluid communication between at least one inert gas source and the space between the inner chamber body wall and the outer chamber body wall that defines at least the portion of the outer chamber and that surrounds the inner chamber body wall during use.

9. The targeted temporal ALD device of claim 8, further comprising: a table comprising a substrate mounting surface configured for receiving one or more substrates; and adjustment means for selectively changing and securing a positioning of the ALD head relative to the substrate mounting surface, wherein the adjustment means for selectively changing and securing a positioning of the ALD head relative to the substrate mounting surface enables selective control for repositioning the ALD head relative to the substrate mounting surface in at least three orthogonal directions during use.

10. The targeted temporal ALD device of claim 9, wherein the adjustment means for selectively changing and securing a positioning of the ALD head relative to the substrate mounting surface further enables the selective control for repositioning the ALD head relative to the substrate mounting surface in at least three different orthogonal directions during use.

11. The targeted temporal ALD device of claim 9, wherein the adjustment means for selectively changing and securing a positioning of the ALD head relative to the substrate mounting surface further enables the selective control and positioning of the ALD head relative to one or more substrates on the substrate mounting surface to be selectively positioned adjacent to the inner chamber and within a predetermined distance from the terminating ends of the inner and outer housings of the ALD head during use.

12. The targeted temporal ALD device of claim 11, further comprising positioning controls for controlling the adjustment means for selectively changing and securing a positioning of the ALD head relative to the substrate mounting surface and for enabling selective positioning of the one or more positioned on the substrate mounting surface to be selectively positioned adjacent to the inner chamber and within the predetermined distance from the terminating ends of the inner and outer housings of the ALD during use.

13. The targeted temporal ALD device of claim 8, further comprising:
   one or more precursor gas sources configured to contain one or more precursor gases.

14. The targeted temporal ALD device of claim 13, further comprising:
   one or more inert gas sources configured to contain one or more inert gases.

15. The targeted temporal ALD device of claim 14, further comprising flow controls for (1) controlling a flow of the one or more precursor gases from the one or more precursor sources into and out of the inner chamber, for (2) controlling a flow of the one or more inert gases from the one or more inert gas sources into and out of the outer chamber and for (3) controlling a flow of the one or more inert gases from the one or more inert gas sources into and out of the inner chamber.

16. The targeted temporal ALD device of claim 15, the flow controls including at least one or more of: computer-executable code and one or more processor(s) configured to execute the computer-executable code, one or more sensors that are operable to detect a pressure within the inner chamber and/or the outer chamber, one or more sensors that are operable to detect a flow of the one or more inert and/or precursor gases into and out of the inner chamber and/or the outer chamber, or one or more valves that are operable to selectively control the flow of the one or more inert and/or precursor gases into and out of the inner chamber and/or the outer chamber.

17. The targeted temporal ALD device of claim 8, wherein the inner housing is affixed in an unmovable position relative to the outer housing.

18. The targeted temporal ALD device of claim 8, wherein the terminating ends of the inner and outer housings are substantially in coplanar alignment.

\* \* \* \* \*